(12) United States Patent
Rankov et al.

(10) Patent No.: US 9,755,010 B2
(45) Date of Patent: Sep. 5, 2017

(54) PIXEL DRIVER CIRCUIT

(71) Applicant: FlexEnable Limited, Cambridge, Cambridgeshire (GB)

(72) Inventors: Aleksandra Rankov, Novi Sad (RS); Charlotte Harrison, Huntingdon (GB); Ian Horne, Cambridge (GB); Shane Norval, Cambridge (GB); Jeremy Hills, St. Neots (GB); Burag Yaglioglu, Cambridge (GB)

(73) Assignee: FlexEnable Limited, Cambridge, Cambridgeshire (GB)

( * ) Notice: Subject to any disclaimer, the term of this patent is extended or adjusted under 35 U.S.C. 154(b) by 0 days.

(21) Appl. No.: 15/100,969

(22) PCT Filed: Dec. 3, 2014

(86) PCT No.: PCT/GB2014/053595
§ 371 (c)(1),
(2) Date: Jun. 1, 2016

(87) PCT Pub. No.: WO2015/082921
PCT Pub. Date: Jun. 11, 2015

(65) Prior Publication Data
US 2016/0307987 A1    Oct. 20, 2016

(30) Foreign Application Priority Data
Dec. 3, 2013    (GB) .................................. 1321285.7

(51) Int. Cl.
*H01L 27/12*    (2006.01)
*H01L 27/32*    (2006.01)
(Continued)

(52) U.S. Cl.
CPC ...... *H01L 27/3274* (2013.01); *H01L 27/1251* (2013.01); *H01L 27/283* (2013.01);
(Continued)

(58) Field of Classification Search
None
See application file for complete search history.

(56) References Cited

U.S. PATENT DOCUMENTS 4,924,279 A    5/1990   Shimbo
5,604,511 A *  2/1997   Ohi ..................... G09G 3/3648
                                                    345/88

(Continued)

FOREIGN PATENT DOCUMENTS

EP    1659647 A1    5/2006
JP    2008-177398   7/2008
(Continued)

OTHER PUBLICATIONS

European Search Report for Application No. GB 1321285.7 dated May 19, 2014 in 4 pages.
(Continued)

*Primary Examiner* — Michael Lebentritt
(74) *Attorney, Agent, or Firm* — Knobbe Martens Olson & Bear LLP

(57) ABSTRACT

A pixel driver circuit having only three conductive layers is described. The pixel driver circuit comprises a vertical driver transistor (26) spanning said three conductive layers, wherein a first of said conductive layers (22) on a first side of a middle conductive layer (32) provides a first source-drain connection (52) of said driver transistor, wherein a third of said conductive layers (34) on the opposite side of said middle conductive layer to said first conductive layer provides a gate connection (54) for said vertical driver transistor, and wherein said middle conductive layer provides a second source-drain connection (50) for said vertical driver transistor. The circuit also comprises a lateral switching transistor (30) with source-drain connections (44,46) in one of said three conductive layers. A dielectric layer (16, 20) is provided between said first and second conductive
(Continued)

layers and between said second and third conductive layers, and wherein semiconductor material (18) is provided spanning said first and second source-drain connections of said vertical driver transistor. A pixel display element (12) is coupled to said first source-drain connection of said vertical driver transistor.

20 Claims, 11 Drawing Sheets

(51) Int. Cl.
    *H01L 29/786* (2006.01)
    *H01L 51/05* (2006.01)
    *H01L 27/28* (2006.01)

(52) U.S. Cl.
    CPC ...... *H01L 27/3246* (2013.01); *H01L 27/3262* (2013.01); *H01L 27/3265* (2013.01); *H01L 29/78642* (2013.01); *H01L 51/057* (2013.01); *H01L 2227/323* (2013.01); *H01L 2251/5338* (2013.01)

(56) References Cited

U.S. PATENT DOCUMENTS

| | | | |
|---|---|---|---|
| 5,780,327 | A | 7/1998 | Chu et al. |
| 6,559,822 | B2* | 5/2003 | Okuzono ............ G09G 3/3614 345/96 |
| 7,489,291 | B2* | 2/2009 | Yamazaki ............ G09G 3/3648 345/36 |
| 2002/0160553 | A1* | 10/2002 | Yamanaka .......... H01L 27/1285 438/149 |
| 2004/0245524 | A1 | 12/2004 | Hirakata et al. |
| 2004/0251461 | A1* | 12/2004 | Anzai ................. H01L 27/1214 257/59 |
| 2006/0246637 | A1 | 11/2006 | Voutsas et al. |
| 2007/0069248 | A1* | 3/2007 | Ohta ................. H01L 27/14627 257/239 |
| 2007/0254402 | A1 | 11/2007 | Dimmler et al. |
| 2008/0198182 | A1* | 8/2008 | Uchino ................ G09G 3/3233 345/690 |
| 2008/0225025 | A1* | 9/2008 | Uchino ................ G09G 3/3233 345/204 |
| 2008/0237580 | A1 | 10/2008 | Okuyama et al. |
| 2009/0224235 | A1 | 9/2009 | Kitamura et al. |
| 2013/0234128 | A1 | 9/2013 | Aomori |
| 2014/0340363 | A1* | 11/2014 | Ikeda ...................... G06F 3/042 345/175 |
| 2016/0117045 | A1* | 4/2016 | Yamazaki .............. H03B 5/364 345/173 |

FOREIGN PATENT DOCUMENTS

| | | |
|---|---|---|
| JP | 2013-115111 | 6/2013 |
| JP | 2013-254859 | 12/2013 |
| WO | WO 01/47043 | 6/2001 |
| WO | WO 01/47045 | 6/2001 |
| WO | WO 2004/070466 | 8/2004 |
| WO | WO 2006/056808 | 6/2006 |
| WO | WO 2006/059162 | 6/2006 |
| WO | WO 2006/061654 | 6/2006 |
| WO | WO 2006/106365 | 10/2006 |
| WO | WO 2007/029028 | 3/2007 |
| WO | WO 2012/078759 A2 | 6/2012 |

OTHER PUBLICATIONS

International Search Report for International Application No. PCT/GB2014/053595 mailed Feb. 11, 2015 in 4 pages.
Written Opinion for International Application No. PCT/GB2014/053595 mailed Feb. 11, 2015 in 8 pages.
Thornwood, Short-Channel Field-Effect Transistor, IBM Technical Disclosure Bulletin, International Business Machines Corp., US, Aug. 1, 1989, p. 77-78, vol. 32, No. 3A XP0000493570.
Search Report for Application No. GB 1421500.8 dated May 15, 2015.

* cited by examiner

PIXEL DRIVER CIRCUIT

FIELD OF THE INVENTION

This invention relates to pixel driver circuits, and in particular to pixel driver circuits for organic light-emitting diode (OLED) displays.

BACKGROUND TO THE INVENTION

Organic light-emitting diodes (OLED) are commonly used to provide displays in electronic display devices. Typically, OLEDs are driven by an active matrix backplane, i.e. a matrix or array of thin film transistors (TFT) or organic TFTs (OTFT). Each pixel of the OLED display is selectively addressed by an individual TFT of the backplane to change the state of the pixel.

One commonly used pixel circuit for OLED displays comprises two transistors and one capacitor ("2T1C"). One of the transistors is an addressing transistor, while the other is a driving transistor. The addressing transistor transfers voltage from a data line to the gate of the driving transistor. The driving transistor converts the data voltage to a corresponding current for the OLED pixel.

Typically, amorphous silicon or polycrystalline silicon TFTs are used in the pixel circuit, but OLED pixels may also be driven by OTFTs where the channel is made from an organic semiconductor. However, organic semiconductors have low charge mobility, which dictates usage of large transistors to drive OLED pixels. Consequently, the low charge mobility of organic semiconductors means that high-density OLED pixels cannot be as easily achieved compared to amorphous silicon or polycrystalline silicon TFTs.

US2008/237580, US2009/224235 and JP2013254859 describe known structures.

The present applicant has recognised the need to provide a pixel structure which enables the processing of high-density OTFT-driven OLED panels to be operated at low voltages.

SUMMARY OF THE INVENTION

According to a first aspect of the present invention, there is provided a method of fabricating a pixel driver circuit using only three conductive layers, the method comprising: forming a vertical driver transistor spanning said three conductive layers, wherein a first of said conductive layers on a first side of said middle conductive layer provides a first source-drain connection of said driver transistor, wherein a third of said conductive layers on the opposite side of said middle conductive layer to said first conductive layer provides a gate connection for said vertical driver transistor, and wherein said middle conductive layer provides a second source-drain connection for said vertical driver transistor; forming a lateral switching transistor with source-drain connections in one of said three conductive layers; wherein a dielectric layer is provided between said first and second conductive layers and between said second and third conductive layers, and wherein semiconductor material is provided spanning said first and second source-drain connections of said vertical driver transistor.

The following features apply to all aspects of the invention.

A vertical transistor may be defined as a transistor having a semiconductor channel which is perpendicular to the substrate on which the pixel circuit is formed. In other words, the source and drain electrodes are arranged in different layers of the structure so that they are vertically spaced relative to each other. By contrast, a horizontal or lateral transistor may be defined as a transistor having a semiconductor channel which is generally parallel to the substrate on which the pixel circuit is formed. The source and drain electrodes are arranged in the same layer of the structure so that they are laterally or horizontally spaced relative to each other. The first source-drain connection of the driver transistor may be the drain electrode and the second source-drain connection of the driver transistor may be the source electrode or vice versa. The source-drain connections of the lateral switching transistor may comprise both the source and drain electrodes.

The conductive layer may be formed from a conducting polymer such as PEDOT or from a conducting material such as an inorganic metal, for example, gold, copper or silver and thus may be a metal layer. The semiconductor material may be an organic semiconductor material, for example, a solution processable conjugated polymeric or oligomeric material.

To overcome the above-mentioned problem of low charge mobility in organic semiconductors, in embodiments, the organic electronic pixel driver circuit includes two transistors and one capacitor (2T1C pixel), where one of the transistors is vertical. Vertical transistors can be utilized as driver transistors, which generally provide much larger width to length aspect ratios (W/L) per TFT area than horizontal or lateral transistors. A large W/L aspect ratio for the driver transistor enables OTFTs to be operated at lower voltages. The vertical transistor is a drive transistor and provides a current to drive the light-emitting element of the pixel. The lateral transistor is a select or addressing transistor which may be also termed a switching transistor.

In embodiments, the method further comprises forming a wall extending vertically between said first and second source-drain connections of said vertical driver transistor, wherein said semiconductor material is disposed over said wall to form a vertically-extending channel of said vertical driver transistor.

In embodiments, the source-drain connections of the lateral switching transistor may be formed in the middle conductive layer. The gate of the lateral switching transistor may be formed in the first or third conductive layer depending on whether or not a bottom or top emission structure is to be formed. Alternatively, the source-drain connections of the lateral switching transistor may be formed in the first conductive layer. In this case, the gate of the lateral switching transistor may be formed in the third conductive layer.

In embodiments, the source-drain connections of the lateral switching transistor are formed in the first conductive layer and the wall may be formed by removing the dielectric layer between said first and second conductive layers above the source-drain connections of the lateral switching transistor. Alternatively, the source-drain connections of the lateral switching transistor are formed in the middle conductive layer and the method may comprise forming a trench in one of said dielectric layers between the lateral switching transistor and the vertical driver transistor, wherein said wall comprises a sidewall of said trench.

In embodiments, the method comprises forming a common semiconductor for both the lateral switching transistor and the vertical driver transistors. The method may further comprise isolating the semiconductor material spanning said first and second source-drain connections of said vertical driver transistor from the semiconductor material covering said first and second source-drain connections of said lateral switching transistor. Where there is a trench, the semiconductor isolation may be formed in the trench. Alternatively, a third dielectric layer may be formed over the middle conductive layer and the third dielectric layer and semiconductor material may be removed between the lateral switching transistor and the vertical driver transistor to form the isolation.

In embodiments, the method further comprises fabricating a dielectric bank over an uppermost of said conductive layers, said bank defining a well for OLED material, wherein a base of said well is formed by said uppermost conductive layer, and wherein said uppermost conductive layer and wherein said uppermost conductive layer is electrically connected to said first source-drain connection of said vertical driver transistor. Thus, the third conductive layer may comprise a pixel electrode which may be the base of the well.

In embodiments, the third conductive layer is an uppermost of said conductive layers, furthest from a substrate of said driver circuit.

As set out above, the organic electronic pixel driver circuit may include two transistors and one capacitor (2T1C pixel). In embodiments, the method further comprises forming a gate-storage capacitor, to store a drive level for said driver transistor, between said middle, second conductive layer and said third conductive layer.

According to another aspect of the present invention, there is provided a method of fabricating a two transistor one capacitor active matrix pixel driver circuit using only three metal layers, the method comprising: forming a lateral switching transistor with source-drain connections in a middle, second metal layer of said three metal layers; and forming a vertical driver transistor spanning said three metal layers, wherein a first of said metal layers on a first side of said middle metal layer provides a first source-drain connection of said driver transistor, wherein a third of said metal layers on the opposite side of said middle metal layer to said first metal layer provides a gate connection for said vertical driver transistor, and wherein said middle metal layer provides a second source-drain connection for said vertical driver transistor; wherein a dielectric layer is provided between said first and second metal layers and between said second and third metal layers, and wherein semiconductor material is provided spanning said first and second source-drain connections of said vertical driver transistor.

According to a further aspect of the invention, there is provided a pixel driver circuit using only three conductive layers, comprising: a vertical driver transistor spanning said three conductive layers, wherein a first of said conductive layers on a first side of a middle conductive layer provides a first source-drain connection of said driver transistor, wherein a third of said conductive layers on the opposite side of said middle conductive layer to said first conductive layer provides a gate connection for said vertical driver transistor, and wherein said middle conductive layer provides a second source-drain connection for said vertical driver transistor; a lateral switching transistor with source-drain connections in one of said three conductive layers; and wherein a dielectric layer is provided between said first and second conductive layers and between said second and third conductive layers, and wherein semiconductor material is provided spanning said first and second source-drain connections of said vertical driver transistor; and a pixel display element coupled to said first source-drain connection of said vertical driver transistor.

According to a further aspect of the invention, there is provided a flexible active matrix backplane comprising a flexible substrate bearing a plurality of pixel driver circuits as recited above.

According to a further aspect of the invention, there is provided a display comprising the above flexible active matrix backplane.

More preferably, each layer of the backplane structure is flexible to create a fully flexible display device. Advantageously, a flexible OLED display device, such as electronic paper or a flexible display panel, can be manufactured. The substrate may be formed of a flexible polymer such as PVC, PET (polyethyleneterephthalate) or PEN (polyethelenemaphthalene).

As set out above, the use of a vertical driver transistor enables OTFT (organic thin film transistors) to be operated at lower voltages. In the above arrangement, the switching (or select/addressing) transistor is a lateral transistor but it is possible to have arrangements where this is not the case.

According to another aspect of the present invention, there is provided an organic electronic pixel driver circuit for driving a pixel, said pixel driver circuit comprising: a first organic transistor; and a second organic transistor, wherein said second transistor is a driver transistor operable to provide a drive current for said pixel; wherein said first transistor is a switching transistor which is coupled to said driver transistor and is operable to selectively address said pixel; wherein said driver transistor is a vertical transistor. In such an arrangement, the pixel circuit preferably further comprises a common semiconductor layer which forms the channel for both transistors in the pixel circuit.

As before, the following features apply to all aspects of the invention including those mentioned above.

In a pixel array formed of pixels driven by a 2T1C circuit, each pixel circuit has a power and a ground connection. Each row of pixels has a common row select line and each column of pixels has a common data line, such that a row/column of pixels can be addressed together. Thus, the row select lines and column data lines interconnect the pixels in the array.

Therefore, in embodiments of the invention, the transistors comprise a source-drain layer/connections and a gate electrode, said pixel circuit further comprising: a pixel data line coupled to said source-drain layer/connections of said first transistor to selectively provide a programming voltage to said pixel driver circuit; a pixel select line coupled to said gate electrode of said select transistor, wherein said gate electrode of said select transistor is selectively coupled to said pixel data line; and a pixel electrode coupled to said source-drain connections of said driver transistor.

The source-drain connection of the driver transistor may be the drain electrode and the source electrodes which are arranged vertically relative to each other. The source-drain layer/connections of the select transistor comprise the source and drain electrodes which are in the same layer for a lateral transistor. The pixel data line provides a programming voltage to program the voltage output of the driver transistor. The pixel select line controls when the gate electrode of the select transistor is able to selectively address the pixel.

In an active matrix display comprising an array of pixels, each driven by an individual pixel driver circuit, a storage capacitor is required to enable the pixel state of an individual pixel in the array to be actively maintained while other pixels are being addressed. Thus, in embodiments, the pixel driver circuit includes a storage capacitor for storing a pixel value. The storage capacitor is coupled between at least one of the source-drain connections of the driver transistor and the gate electrode of the driver transistor, and wherein a voltage on said pixel data line is stored in said storage capacitor. When the pixel select line voltage indicates the pixel is being addressed, the source-drain layer of the select transistor goes to the programming voltage of the data line, which can then be stored on the storage capacitor during the non-address time.

Preferably, the select transistor and the driver transistor are both organic thin film field-effect transistors (OTFT). That is, at least the semiconductor layer of each of the transistors is formed of an organic semiconductor material. (Other transistor layers may or may not be formed of organic material.) The organic semiconductor material may be, for example, a solution processable conjugated polymeric or oligomeric material. In embodiments, the select transistor is a horizontal OTFT.

In embodiments, the pixel comprises a light-emitting diode (LED) or an organic LED. Alternatively, in embodiments the pixel comprises other current-driven light-emitting materials.

In embodiments, the pixel circuit is formed on a flexible substrate, preferably a flexible plastic substrate. More preferably, each element of the pixel circuit is flexible such that a flexible display device, such as a flexible LED/OLED display panel, can be manufactured. The substrate may be formed of a flexible polymer such as PVC, PET (polyethyleneterephthalate) or PEN (polyethelenemaphthalene).

Additionally or alternatively, the substrate may be formed of a flexible, transparent material, so that the pixel circuit can be adapted to bottom emission, where light exits the device through the substrate (i.e. bottom of the pixel circuit).

In embodiments, the pixel circuit comprises a dielectric layer patterned to form a trench between the second vertical transistor and the first transistor. The common semiconductor layer may be disposed over the dielectric layer. The semiconductor material may be disposed over a side wall of the trench to form the (vertical) channel for the driver transistor.

As the semiconductor layer is common to both transistors, electrical current leakage may occur between the transistors, which may affect operation of the pixel circuit. In a pixel array, current leakage may occur between transistors of adjacent pixels in the array. Thus, in embodiments, the trench between the select and driver transistors comprises a region with no semiconductor material. The region may be provided by a semiconductor isolation (or shallow trench isolation), by either laser etching or lithographic patterning techniques to remove semiconductor material in a region of the trench. Where there is no trench between the select and driver transistors, a semiconductor isolation may be formed by forming a third dielectric layer over the middle conductive layer and removing the third dielectric layer and semiconductor material between the lateral switching transistor and the vertical driver transistors.

Preferably, the source-drain connections of the driver transistor have a comb structure. Because it is a vertical transistor, the semiconductor channel of the driver transistor is perpendicular to the substrate. As mentioned earlier, it is desirable to operate OTFTs at low voltages and to generate large currents per OTFT area. In particular, it is desirable to have a large width-to-length (W/L) aspect ratio. To increase the width of the driver transistor, for example, the source electrode of the driver transistor is patterned into a comb structure and a drain electrode extends around the perimeter of each of the source fingers. Thus, the comb structure increases the width of the driver transistor. Lithography techniques may be used (as described below) to produce vertical channel lengths in the range of 1 μm to 5 μm. Preferably, the vertical channel length is less than 1 μm. This is readily achievable since the vertical channel is formed of the sidewall of a dielectric layer between the source and drain electrodes of the driver transistor, and thus, the thickness of the dielectric layer controls the driver transistor channel length. Accordingly, a large W/L ratio is achievable with the driver transistor and comb source-drain structure.

According to a related aspect of the invention, there is provided an active matrix backplane comprising a flexible substrate bearing a plurality of organic electronic pixel driver circuits as recited above.

According to another aspect of the invention, there is provided an optoelectronic device comprising a plurality of organic electronic pixel driver circuits as recited above.

According to another aspect of the invention, there is provided a pixel circuit comprising: a substrate; a first conductive layer disposed over said substrate, wherein said first conductive layer is patterned to form at least a drain electrode of a vertical driver transistor; a first dielectric layer disposed over said first conductive layer; a second conductive layer disposed over said first dielectric layer, wherein said second conductive layer is patterned to form at least a source electrode of said vertical driver transistor; a semiconductor material disposed over said second conductive layer and provided on a side wall of said first dielectric layer between said source and drain electrodes of said vertical driver transistor to form a channel for said vertical driver transistor; a second dielectric layer disposed over said semiconductor material; a third conductive layer disposed over said second dielectric layer, wherein said conductive layer is patterned to form at least a gate electrode for said vertical driver transistor and a pixel electrode for a light-emitting element; a select transistor comprises a source electrode, a drain electrode and a gate electrode each of which is patterned in one of the first, second and third conductive layers; and a dielectric bank layer disposed over said third conductive layer, wherein said bank layer is patterned to form a well in which said light-emitting element is provided, wherein a base of said well is provided by said pixel electrode.

The conductive material may be an inorganic metal, for example, gold, copper or silver, or a conducting polymer. The source and drain electrodes of the select transistor may be in the same conductive layer to form a source-drain layer within a horizontal select transistor. The source and drain electrodes of the select transistor may be in the first or second conductive layer. Depending on the position of the source and drain electrodes of the select transistor, the gate electrode of the select transistor may be in the first or third conductive layer. When the source and drain electrodes of the select transistor are in the second conductive layer, said first dielectric layer may be patterned to form a trench between said vertical transistor and a horizontal organic select transistor.

Thus, according to another aspect of the invention, there is provided a pixel circuit comprising: a substrate; a first metal layer disposed over said substrate, wherein said first metal layer is patterned to form a drain electrode of a vertical organic driver transistor; a first dielectric layer disposed over said first metal layer, wherein said first dielectric layer is patterned to form a trench between said vertical transistor and a horizontal organic select transistor; a second metal layer disposed over said first dielectric layer, wherein said second metal layer is patterned to form a source-drain layer of said select transistor and said source electrode of said vertical driver transistor; a semiconductor material disposed over said second metal layer and provided on side walls and a base of said trench, wherein said semiconductor material disposed over said source-drain layer of said vertical driver transistor provides a channel for said horizontal transistor, and wherein said semiconductor material provided on one of said side walls of said trench forms a channel for said vertical transistor; a second dielectric layer disposed over said semiconductor material; a third metal layer disposed over said second dielectric layer, wherein said third metal layer is patterned to form a gate electrode of said horizontal transistor, a gate electrode for said vertical transistor and a pixel electrode for a light-emitting element; and a dielectric bank layer disposed over said third metal layer, wherein said bank layer is patterned to form a well in which said light-emitting element is provided, wherein a base of said well is provided by said pixel electrode.

The following features apply to all aspects of the invention.

Preferably, the pixel circuit also comprises a first via to provide an electrical connection between said source-drain layer of said horizontal select transistor and said gate electrode of said vertical transistor; and a second via to provide an electrical connection between said drain electrode of said vertical transistor and said pixel electrode.

In embodiments, a region with no semiconductor material is formed in the trench between the first and second transistors, where the region may be formed using laser etching or lithography.

The patterned layers of the pixel circuit may be patterned using lithographic techniques.

The pixel circuit described in each of the aspects above is generally suitable for top emission, i.e. light is emitted out through the top of the structure. A bottom emission 2T1C pixel can also be realised. In a bottom emission structure, emitted light exits through the substrate. Thus, in embodiments, the substrate may be a transparent or semi-transparent material, such as glass or a polymer. Preferably, the substrate is formed from a flexible transparent material.

In embodiments, the third metal layer is a low resistivity metal, preferably gold. For a bottom emission pixel, the third metal layer may be thin such that emitted light can be transmitted through the third metal layer and out through the transparent substrate.

In embodiments, a bottom emission pixel circuit is formed with a third metal layer that comprises a conductive portion for forming a select line and a transparent portion for forming a pixel electrode, wherein said conductive portion is formed of a low resistivity material, and wherein said transparent portion is provided beneath said light-emitting well and may be formed of indium tin oxide (ITO). The transparent portion is deposited directly below the light-emitting element, such that light can be transmitted through the transparent portion and exit out through the substrate.

In another aspect of the invention, there is provided a method of manufacturing a pixel circuit for driving a pixel wherein said pixel circuit is provided on a substrate, the method comprising: forming a first conductive layer over said substrate, wherein said first conductive layer is patterned to form a drain electrode of a vertical thin film transistor; forming a first dielectric layer over said first conductive layer; forming a second conductive layer over said first dielectric layer, wherein said second conductive layer is patterned to form a source electrode of said vertical transistor; forming a semiconductor material over said second conductive layer and a side wall of said first dielectric layer between said source and drain electrodes of said vertical driver transistor to form a channel for said vertical driver transistor; forming a second dielectric layer over said semiconductor material; forming a third conductive layer over said second dielectric layer, wherein said third conductive layer is patterned to form a gate electrode for said vertical transistor and a pixel electrode for a light-emitting diode (LED); forming a select transistor comprising a source electrode, a drain electrode and a gate electrode each of which is patterned in one of the first, second and third conductive layers; and providing a dielectric bank layer over said third conductive layer, wherein said bank layer is patterned to form a LED well in which said LED is provided, wherein a base of said well is provided by said pixel electrode.

The conductive material may be an inorganic metal, for example, gold, copper or silver, or a conducting polymer. The method may comprise patterning the source and drain electrodes of the select transistor in the same conductive layer to form a source-drain layer within a horizontal select transistor. The method may comprise patterning the source and drain electrodes of the select transistor in the first conductive layer. Alternatively, they may be patterned in the second conductive layer. Depending on the position of the source and drain electrodes of the select transistor, the gate electrode of the select transistor may be patterned in the first or third conductive layer. When the source and drain electrodes of the select transistor are in the second conductive layer, said first dielectric layer may be patterned to form a trench between said vertical transistor and a horizontal organic select transistor.

Thus, in another aspect of the invention, there is provided a method of manufacturing a pixel circuit for driving a pixel wherein said pixel circuit is provided on a substrate, the method comprising: forming a first metal layer over said substrate, wherein said first metal layer is patterned to form a drain electrode of a vertical thin film transistor; forming a first dielectric layer over said first metal layer, wherein said first dielectric layer is patterned to form a trench between said vertical transistor and a horizontal thin film transistor; forming a second metal layer over said first dielectric layer, wherein said second metal layer is patterned to form a source-drain layer of said horizontal transistor and said source electrode of said vertical transistor; forming a semiconductor material over said second metal layer and provided on side walls and a base of said trench, wherein said semiconductor material disposed over said source-drain layer of said horizontal transistor provides a channel for said horizontal transistor, and wherein said semiconductor material provided on one of said side walls of said trench forms a channel for said vertical transistor; forming a second dielectric layer over said semiconductor material; forming a third metal layer over said second dielectric layer, wherein said third metal layer is patterned to form a gate electrode of said horizontal transistor, a gate electrode for said vertical transistor and a pixel electrode for a light-emitting diode (LED); and providing a dielectric bank layer over said third metal layer, wherein said bank layer is patterned to form a LED well in which said LED is provided, wherein a base of said well is provided by said pixel electrode.

Preferably, a region with no semiconductor material is formed in the trench between the vertical and horizontal transistors after the semiconductor layer is patterned. The region may be formed using laser etching or lithography.

In a top emission structure, the third metal layer provides the row select line, which ensures that the select transistor is on during address time (i.e. during charging of the storage capacitor) and off during non-address (frame) time. In broad terms, the programming time of an active matrix pixel driver circuit is proportional to the capacitance and the resistance through which the capacitor is charged. To avoid a delay in the programming time, particularly for pixels at the edge of a display (i.e. at a far end of a row select line), it is necessary to reduce the resistance of the row select line, for example, by using a select line with a large thickness/depth. However, for a bottom emission structure, the thickness of the third metal layer below the LED blocks light and prevents/reduces emission through the substrate.

Thus, according to a further aspect of the invention, there is provided a pixel circuit (for a bottom emission structure) comprising: a semi-transparent or transparent substrate; a first metal layer disposed over said substrate, wherein said first metal layer is patterned to form a drain electrode of a vertical organic transistor, a pixel select line and a gate electrode of a horizontal organic transistor; a first dielectric layer disposed over said first metal layer, wherein said first dielectric layer is patterned to form a trench between said vertical transistor and said horizontal transistor; a second metal layer disposed over said first dielectric layer, wherein said second metal layer is patterned to form a source-drain layer of said horizontal transistor and said source electrode of said vertical transistor; a semiconductor material disposed over said second metal layer and provided on side walls and a base of said trench, wherein said semiconductor material disposed over said source-drain layer of said horizontal transistor provides a channel for said horizontal transistor, and wherein said semiconductor material provided on one of said side walls of said trench forms a channel for said vertical transistor; a second dielectric layer disposed over said semiconductor material; a third metal layer disposed over said second dielectric layer, wherein said third metal layer is patterned to form a gate electrode for said vertical transistor and a pixel electrode for a light-emitting element; and a dielectric bank layer disposed over said third metal layer, wherein said bank layer is patterned to form a well in which said light-emitting element is provided, wherein a base of said well is provided by said pixel electrode.

In this aspect, a bottom emission pixel structure may be provided by moving the pixel select line to the first metal layer. As the pixel select line is typically thick (for lower resistance), the pixel select line prevents bottom emission. Moving the pixel select line means the thick layer is no longer directly beneath the light-emitting element, and thus, emitted light is able to exit the pixel structure through the transparent substrate.

According to a related aspect of the invention, there is provided a method of manufacturing the pixel circuit recited above.

BRIEF DESCRIPTION OF THE DRAWINGS

The invention is diagrammatically illustrated, by way of example, in the accompanying drawings, in which.

DETAILED DESCRIPTION OF THE DRAWINGS

Figure 1:
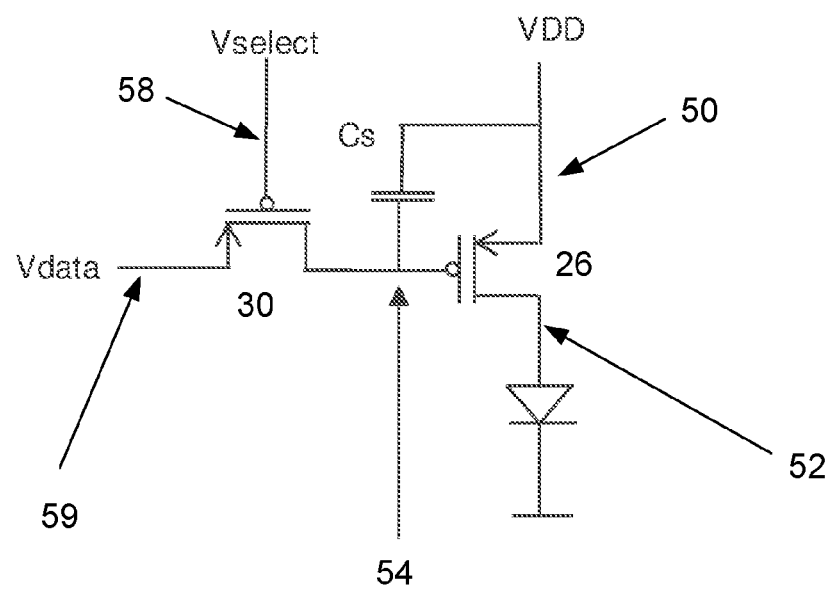
FIG. 1 shows a circuit diagram of a 2T1C pixel according to an embodiment of the invention.

FIG. 1 shows an exemplary circuit diagram for a 2T1C pixel according to an embodiment of the invention. The pixel circuit comprises two transistors and one capacitor (2T1C pixel), where one of the transistors is vertical (i.e. the transistor channel is vertical/perpendicular to a substrate on which the pixel is formed) and the other is horizontal. Preferably, the vertical transistor 26 is a drive transistor and the horizontal transistor 30 is a select or addressing transistor. It will be appreciated that the select transistor need not be horizontal, and could be another vertical transistor. However, one advantage to having a vertical drive transistor and a horizontal select transistor is the reduction or prevention of an error voltage on the gate of the drive transistor. If the select transistor were vertical, the drain and source electrodes of the transistor overlap. Consequently, an error voltage is added to the drain due to the coupling of the data line (the source of the select transistor) with the drain electrode (which is connected to the gate of the driver transistor). This problem does not occur with a vertical drive transistor because the source is held at a particular voltage (VDD).

In a pixel array formed of pixels driven by a 2T1C circuit, each pixel circuit has a power and a ground connection. Each row of pixels has a common row select line 58 and each column of pixels has a common data line 59, such that a row/column of pixels can be addressed together. Thus, the row select lines and column data lines interconnect the pixels in the array. Each pixel has an OLED connected in series with the drive transistor 26. Preferably, for p-type 2T1C circuits, the OLED is connected to the drain node of the second, vertical transistor. This ensures that any variations in voltage drop across the OLED only affect the drain-to-source voltage ($V_{DS}$) of the second transistor, and not the gate-to-source voltage ($V_{GS}$) of the second transistor. (Since the drive transistor operates in saturation, the current through the drive transistor does not change even if $V_{DS}$ changes, but the same is not true for $V_{GS}$.) The drain of addressing transistor 30 is connected through a via (not shown) to the gate electrode 54 of the vertical drive transistor 26. For an active matrix display, a storage capacitor Cs is formed between the source electrode 50 (VDD) and the gate electrode 54 of the vertical transistor, where the capacitor enables the pixel state to be actively maintained while other pixels are being addressed. That is, when the voltage on the pixel select line 58 indicates that the pixel is being selectively addressed, the addressing transistor 30 is coupled to a programming voltage on the pixel data line/common data line 59 and capacitor 36 stores the programming voltage to maintain the pixel state. Driver transistor 26 passes a current, dependent on the programming voltage on the data line, to OLED. Consequently, the output voltage of the addressing transistor 30 controls the current through the OLED and the overall brightness of the OLED.

As mentioned above, OLED pixels may also be driven by OTFTs where the channels are formed of an organic semiconductor. However, organic semiconductors have low charge mobility, which requires usage of large aspect ratio OTFTs, thereby limiting the pixel density that can be achieved in OLED displays. An advantage of the present invention is that vertical transistors enable larger drive currents to be produced per OTFT area compared to horizontal transistors, because a greater number of vertical transistors can be packed into an area compared to horizontal transistors. That is, a higher density of transistors can be achieved, enabling larger currents to be produced. In order to increase the drive current produced by the vertical TFT, it is necessary to decrease the vertical channel length and increase the channel width. Lithography techniques may be used (as described below) to produce vertical channel lengths in the range of 1 µm to 5 µm. Preferably, the vertical channel length is less than 1 µm. This is readily achievable since the vertical channel is formed of the sidewall of a dielectric layer between the source and drain electrodes of the vertical transistor, and thus, the thickness of the dielectric layer controls the vertical transistor channel length. Accordingly, high density OLED backplanes with a thin organic semiconductor layer and a large width-to-length (W/L) ratio are achievable with the vertical TFTs. In addition, OLED display devices using the 2T1C pixel circuit of the present invention operate at lower voltages than designs with horizontal drive TFTs. Thus, the display devices may be more power efficient and the drive transistor may be more immune against voltage bias stress degradation.

Figure 2:
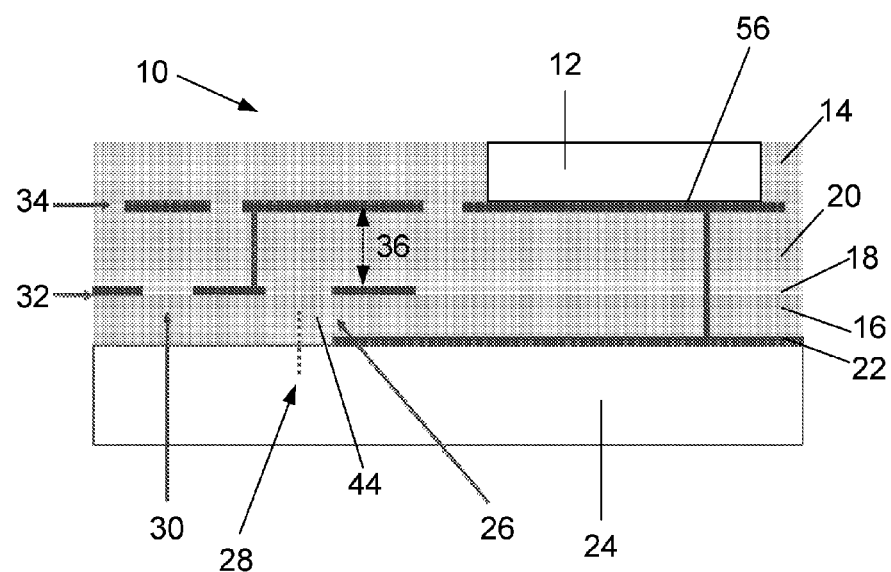
FIG. 2 illustrates an example side view of a 2T1C pixel according to an embodiment of the invention.

Turning now to FIG. 2, this illustrates a side view of a pixel 10 according to an embodiment of the present invention. The pixel 10 is comprised of a substrate 24. A first metal layer 22 is disposed over substrate 24, which may be a flexible substrate. (The fabrication process to manufacture the 2T1C pixel is discussed in more detail below with respect to FIG. 4a-4j.) Preferably, the first metal layer 22 is made of an electrically conductive metal which adheres well to the substrate. A first dielectric layer 16 is disposed over the first metal layer 22, and a second metal layer 32 is disposed over dielectric layer 16. Patterning techniques are used to pattern the dielectric layer 16 and to form trench 38. A semiconductor layer 18 is deposited over the dielectric layer and extends into trench 38. A second dielectric layer 20 is disposed over the semiconductor and a third metal layer 34 is disposed over dielectric layer 20. It is common in OLED displays to provide a bank layer 14 to partition each light-emitting element by banks/walls formed from insulating material e.g. a dielectric material. Consequently, the bank layer 14 is patterned to provide distinct and partitioned OLED areas 12.

Figure 3:
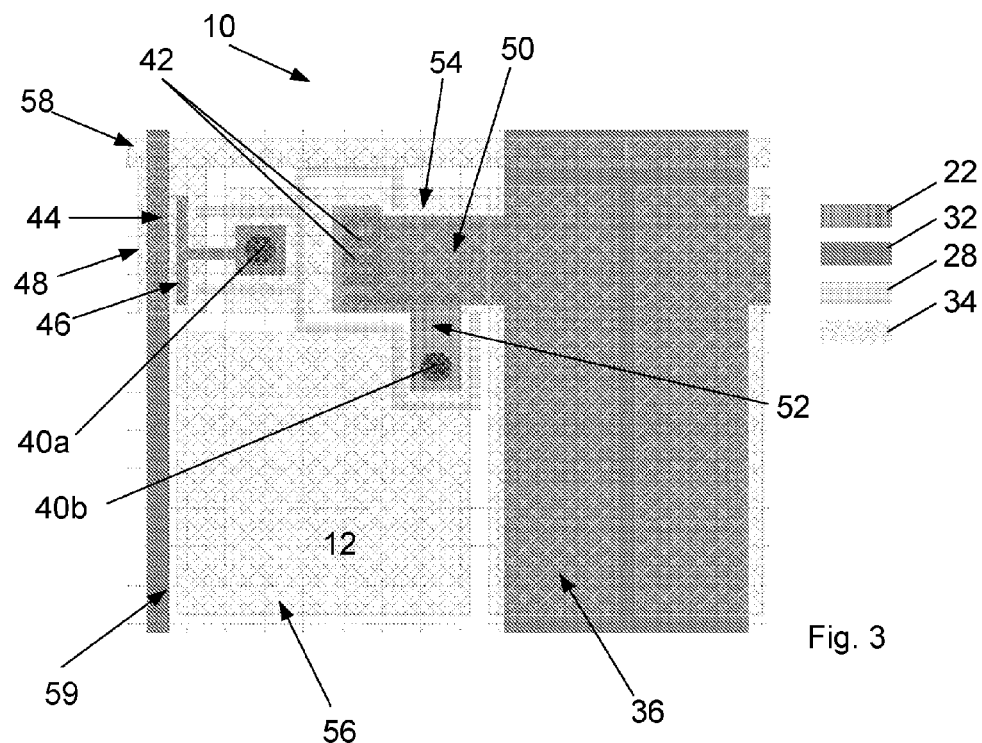
FIG. 3 illustrates a plan view of an example design of the pixel of FIG. 1.

FIG. 3 shows a bird's eye view of a 2T1C pixel design in an embodiment of the invention. The skilled person will appreciate that FIG. 2 is not a cross-sectional view of the design shown in FIG. 3, but is merely a side view to illustrate the layers of the pixel 10. The 2T1C pixel design depicted in FIG. 3 is for a top emission pixel. The first metal layer 22 forms the drain electrode 52 of the vertical transistor and third metal layer 34 forms the gate electrode 54 of the vertical transistor. The third metal layer 34 also forms a row select line 58, a pixel electrode 56, and a gate electrode 48 of the horizontal transistor. Via 40b electrically connects the vertical TFT drain electrode 52 with the pixel electrode. The second metal layer 32 provides the horizontal TFT source electrode 44 and drain electrode 46, and the vertical TFT source electrode 50.

As shown in FIG. 3, the source electrode 50 of the vertical transistor is shaped to form multiple fingers 42 or a comb structure. The semiconductor channel of the vertical transistor is perpendicular to the substrate, and in order to improve the performance of the vertical transistor, it is necessary to decrease the channel length and increase the channel width. Thus, in preferred embodiments, the second metal layer 32 is patterned (as described below) to provide the multiple fingers 42 of the source electrode 50, and the first metal layer 22 is patterned to provide a drain electrode 52 extending beyond the perimeter of the source fingers 42, i.e. to increase the vertical channel width and increase the current output of the drive transistor. Advantageously, the extension of the drain also provides a means to cope with alignment tolerances between layers of the pixel.

FIGS. 4a to 4j illustrate an example process to fabricate the pixel of FIG. 2, and in particular, to form a top emission pixel structure. The pixel circuit is fabricated on a substrate 24, which may be a flexible substrate, more particularly, a flexible plastic substrate. Preferably, each layer of the pixel structure is flexible to create a fully flexible OLED. Advantageously, a flexible OLED device, such as a flexible display panel, can be manufactured. The substrate may be formed of a flexible polymer such as PVC, PET (polyethyleneterephthalate) or PEN (polyethelenemaphthalene).

In the first step of the fabrication process (FIG. 4a), a first metal layer 22 is deposited over substrate 24. Lithographic patterning techniques or direct-write printing techniques may be used to structure metal layer 22 and other layers of the pixel structure. (Precise details of the lithographic patterning and deposition techniques used in the fabrication process are not provided here but are well known in the art.) In a top emission structure, as illustrated here, the first metal layer 22 forms the drain electrode 52 of the vertical TFT 26 and is patterned accordingly. The first metal layer 22 may be formed from a conducting material such as an inorganic metal, for example, gold, copper or silver, or from a conducting polymer such as PEDOT.

In the second step (FIG. 4b), a first dielectric layer 16 is deposited over the patterned first metal layer 22 and the exposed portions of substrate 24. For manufacturing ease, the dielectric material is deposited over the whole surface of the structure. However, the skilled person would understand that alternative techniques may be employed to deposit the dielectric material in the required areas only, such as by a direct-write printing process, for example, inkjet printing. In this case, the fourth step (described below) to pattern the dielectric may not be required.

In the third step (FIG. 4c), a second metal layer 32 is formed over dielectric layer 16. The second metal layer 32 may be formed from the same conducting metal/polymer as the first metal layer 22 or from a different conductive material. The second metal layer forms the source electrode 44 and drain electrode 46 of the horizontal transistor 30, and the source electrode 50 of the vertical transistor 26.

In the fourth step (FIG. 4d), lithographic patterning techniques are used to pattern dielectric layer 16 into the required form. In particular, trench 38 is formed in the dielectric layer 16 so as to provide a gap between the horizontal transistor and the vertical transistor, and to provide a vertical channel between the source electrode 50 and drain electrode 52 of the vertical transistor.

In the fifth step (FIG. 4e), semiconductor layer 18 is deposited over the structure. Conventional TFTs are typically fabricated with inorganic silicon, such as amorphous silicon or polycrystalline silicon. Preferably the pixel structure is fabricated using solution-based thin film transistors (TFTs) preferably patterned by techniques such as direct-write printing, laser ablation or photolithography. Further details can be found in the applicant's earlier patent applications, including, in particular, WO 01/47045, WO 2004/070466, WO 01/47043, WO 2006/059162, WO 2006/056808, WO 2006/061658, WO 2006/106365 (which describes a four- or five-layer pixel architecture) and PCT/GB2006/050265, all hereby incorporated by reference in their entirety. Thus, in embodiments, the TFTs comprise an organic semiconductor material, for example a solution processable conjugated polymeric or oligomeric material, and in embodiments the pixel structure is adapted to solution deposition, for example comprising solution-processed polymers and vacuum-deposited metals.

Figure 4A:
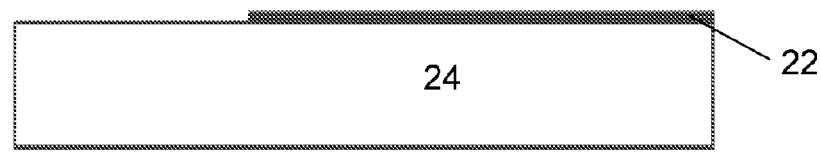
FIGS. 4a to 4j show the step-by-step process of manufacturing the pixel of FIG. 1.
Figure 4B:
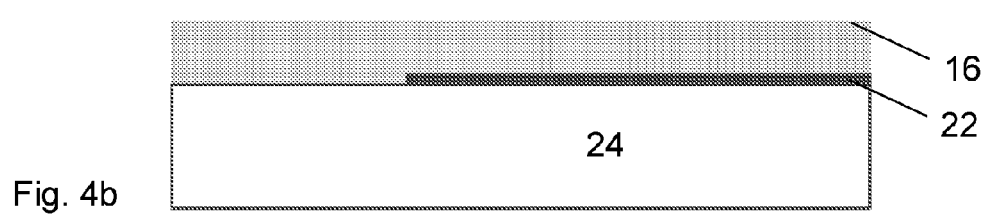
Figure 4C:
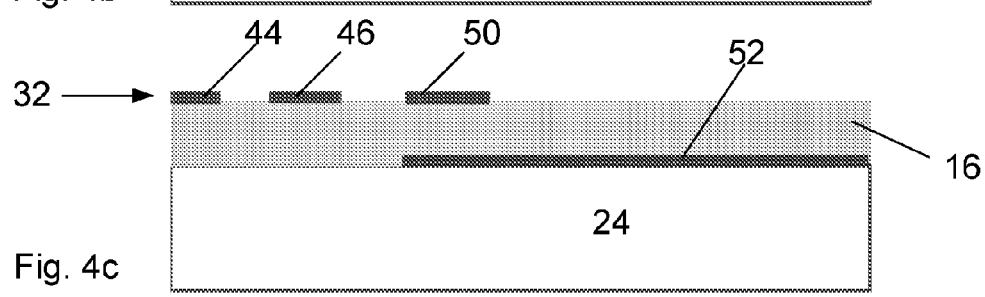
Figure 4D:
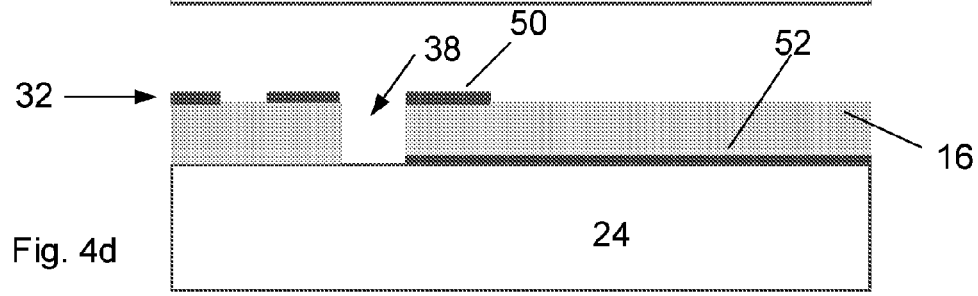
Figure 4E:
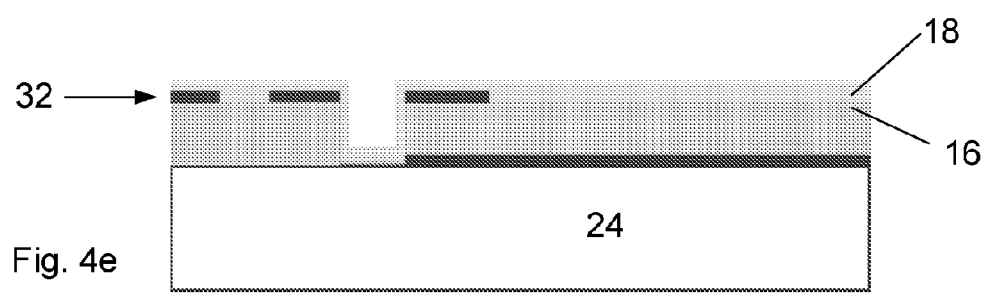
Figure 4F:
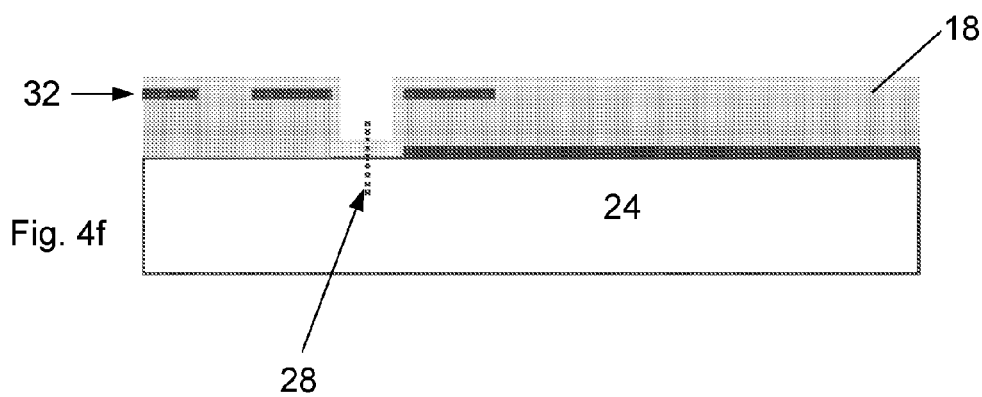
Figure 4G:
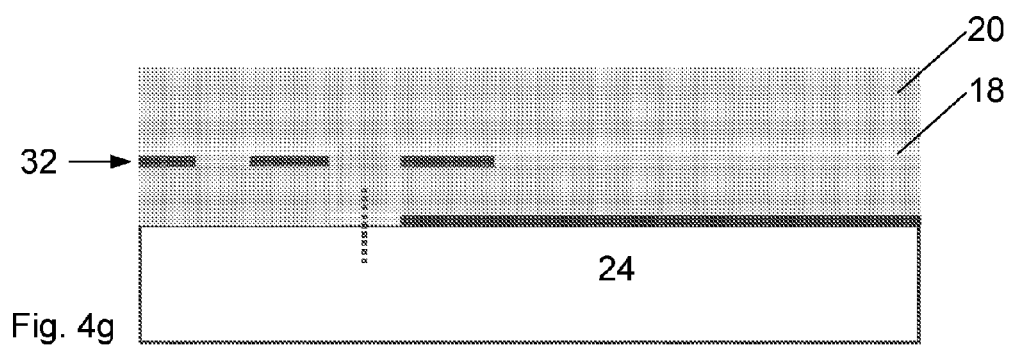
Figure 4H:
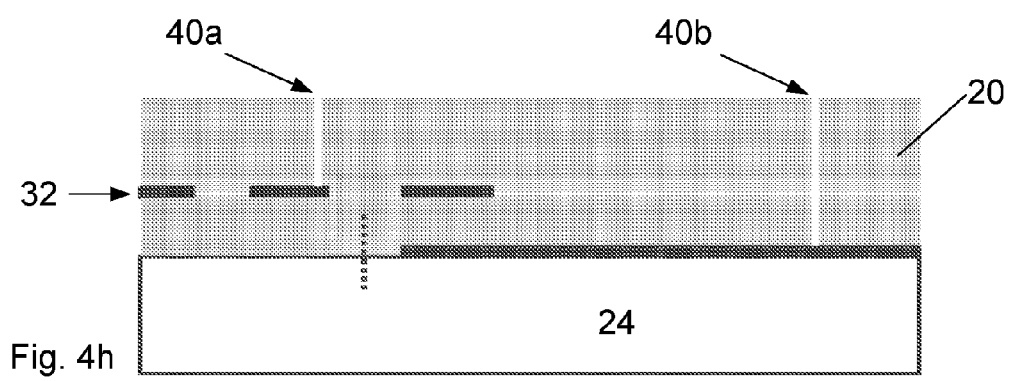

As shown in FIG. 4e, the semiconductor layer 18 is deposited over the entire surface of the structure. Consequently, a semiconductor isolation (or shallow trench isolation) is used to prevent electrical current leakage between the vertical and horizontal transistors, or between the transistors of adjacent pixels in a pixel array. Thus, in the sixth step (FIG. 4f), a semiconductor isolation 28 (dotted line) is formed in trench 38 to remove semiconductor material from layer 18. The semiconductor isolation (SCI) 28 may extend into the substrate 24. The SCI is formed by either laser etching or lithographic patterning techniques. As illustrated in FIG. 3, SCI 28 does not form a complete loop around the transistors. This is because the SCI is etched/patterned after second metal layer 32 is deposited and patterned, and if a complete loop were formed, the techniques used to form the SCI would also etch/pattern the second metal layer. As a result, in the illustrated embodiment the transistors are not fully isolated from each other. However, the alternative path for the current is long enough such that current leakage is not a problem.

In the seventh step (FIG. 4g), a second dielectric layer 20 is deposited over the entire surface of the structure. The second dielectric layer 20 may be formed of the same or a different material to that of the first dielectric layer 16.

In the eighth step (FIG. 4h), a first via 40a is formed through the second dielectric layer 20 in order to provide an electrical connection between the drain electrode 46 of the horizontal addressing transistor and the gate electrode 54 of the vertical driving transistor. A second via 40b is formed through the first dielectric layer 16, the semiconductor layer 18 and the second dielectric layer 20 to provide an electrical connection between the drain electrode 52 of the vertical TFT and the pixel electrode 56 of the OLED. The vias 40a, b may be formed by reactive-ion etching (RIE), which uses a chemically reactive plasma to remove material from the structure. The drain electrode 46 of the addressing transistor also functions to prevent the RIE process from etching through further layers, i.e. it serves as an 'etch stopper'.

In the ninth step (FIG. 4i), a third metal layer 34 is deposited over the structure and into vias 40a, b to provide the electrical connection. Lithographic patterning may be used to form the metal layer in the desired structure. The third metal layer 34 provides the gate electrode 48 of the horizontal transistor, the row select line to which gate electrode 48 is connected, the gate electrode 54 of the vertical transistor and the pixel electrode of the OLED. The third metal layer 34 may be formed from the same conducting metal/polymer as the first metal layer and/or second metal layer, or from an entirely different conductive material. For an active matrix display, a storage capacitor 36 is formed between the source electrode 50 and the gate electrode 54 of the vertical transistor, where the capacitor enables the pixel state to be actively maintained while other pixels are being addressed. Advantageously, no additional metal layer (i.e. no fourth metal layer) is required to form the storage capacitor in the preferred embodiment of the invention, which reduces manufacturing steps and costs.

In the final, tenth step (FIG. 4j), a bank layer 14 is deposited over the structure, where the bank is formed from an insulating material, e.g. a dielectric. As mentioned above, the bank layer 14 partitions each light-emitting element. Lithographic patterning may be used to provide the stepped structure or the walls which define a pixel/OLED area 12. The OLED area 12 is positioned in the bank layer 14 over the pixel electrode 56, and may extend across the entirety of the pixel electrode 56 or over a smaller area (as illustrated).

As mentioned above, FIGS. 2, 3 and 4 represent a top emission pixel design, i.e. light is emitted out through the top of the structure as indicated. A bottom emission 2T1C pixel can also be realised. In a bottom emission structure, light is emitted through substrate 24 (and the intermediate layers), and thus, substrate 24 may be formed of a transparent or semi-transparent material such as glass or a polymer, preferably a flexible transparent material.

In a top emission structure, third metal layer 34 provides the row select line 58, which ensures that the select transistor is on during address time (i.e. during charging of the storage capacitor) and off during non-address (frame) time. As illustrated in FIG. 3, the row select line 58 is a long, narrow conductive element and, in a pixel array, extends across the length of the array. In broad terms, the programming time of an active matrix pixel driver circuit is proportional to the capacitance and the resistance through which the capacitor is charged. To avoid a delay in the programming time, particularly for pixels at the edge of a display (i.e. at a far end of a row select line), it is necessary to reduce the resistance of the row select line, for example, by using a select line with a large thickness/depth. As shown in FIG. 3, the third metal layer 34, which forms the select line, almost covers the entire surface of the pixel, and in particular, metal layer 34 is deposited directly below the OLED area 12. A thick select line (i.e. a thick third metal layer 34) is generally not problematic for a top emission structure where light is emitted through the top of the structure, but for a bottom emission structure, the thickness of the third metal layer 34 below the OLED area 12 blocks light and prevents/reduces emission through the substrate. There are a number of ways to overcome this problem and produce a bottom emission structure:

Form a thin third metal layer 34 from a low resistivity material, such as Au. The thinness of the layer allows light to be transmitted through the layer directly below the OLED area 12 and out through the substrate 24, and the low resistivity material avoids a delay in pixel programming time; and/or Use a two-step patterning technique when forming the third metal layer to provide a layer which is both conductive and transparent. For example, in a first step, after depositing the third metal layer 34 (which may be provided by a low resistivity, non-transparent metal material), patterning techniques are used to pattern the metal material into a select line. This is followed by a second step in which indium tin oxide (ITO) is deposited and patterned to form a transparent OLED anode region. In the pixel structure shown in FIG. 2, ITO may be deposited directly below the OLED region 12, such that light can be transmitted through the ITO layer and be emitted out of the substrate 24; and/or Move the select line to the first metal layer, i.e. form the row select line from the first metal layer 22. This is described in more detail below with respect to FIGS. 5 and 6.

Figure 5:
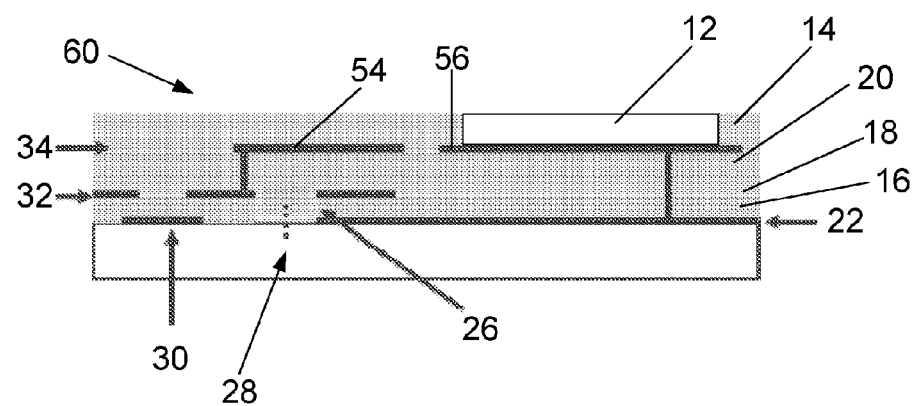
FIG. 5 shows example side view of a 2T1C pixel with a bottom emission structure.

Turning now to FIG. 5, this illustrates a side view of a bottom emission pixel 60 according to an embodiment of the present invention. The pixel 60 is comprised of a substrate 24, which is made of a transparent or semi-transparent material such as glass or a polymer, preferably a flexible transparent material. The structure of the bottom emission pixel is similar to that of the top emission pixel structure of FIG. 2. However, one notable difference is that the row select line and the gate of the horizontal transistor 30 are now formed from the first metal layer 22. The third metal layer 34 continues to provide the gate electrode of the vertical transistor and the pixel electrode. As described above, the select line needs to be formed from a thick layer of material in order to be low resistance. By moving the select line to the first metal layer, as explained in more detail below, the thick layer is no longer directly beneath the OLED area 12 and thus light emission through the bottom of the structure is not blocked.

Figure 6:
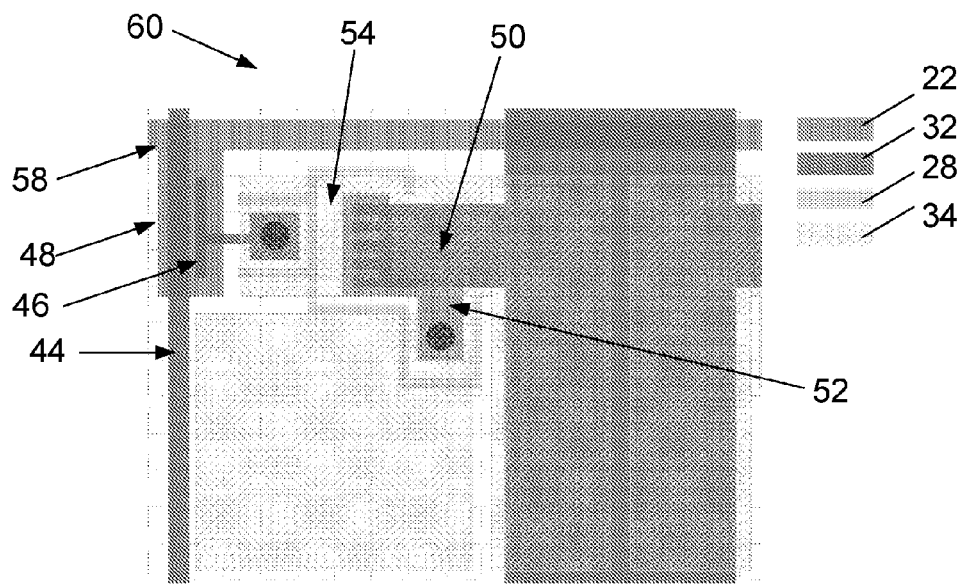
FIG. 6 illustrates a plan view of an example design of the pixel of FIG. 5.

FIG. 6 shows a bird's eye view of a 2T1C pixel with a bottom emission structure in an embodiment of the invention. (The skilled person will appreciate that FIG. 5 is not a cross-sectional view of the design shown in FIG. 6, but is merely a side view to illustrate the layers of the pixel 60).

The first metal layer 22 in the bottom emission structure of FIG. 6 forms the select line 58 of the pixel structure (as well as the drain electrode 52 of the vertical transistor), in contrast with FIG. 3. That is, the gate electrode of the horizontal transistor 30 and the select line are provided by first metal layer 22 (rather than by the third metal layer as in the top emission structure of FIG. 3). The second metal layer 32 provides the source and drain electrodes of the horizontal transistor 30, and the source electrode of the vertical transistor 26. The third metal layer 34 now only forms the gate electrode 54 of the vertical transistor and the pixel electrode 56. As depicted in FIG. 6, a consequence of patterning the first metal layer 22 into the gate electrode 48 and select line 58 is that the thick layer of material is no longer directly beneath the OLED area 12. As a result, the thick material does not block light emission through the bottom of the substrate.

In embodiments, the semiconductor layer 18 of the bottom emission structure may be fully patterned such that the semiconductor material is only present in the channel regions of the vertical and horizontal transistors. Alternatively, the semiconductor layer can be isolated using a semiconductor isolation, as described above.

FIGS. 7a to 7j illustrate an alternative process to fabricate a pixel. The components which are the same as FIGS. 4a to 4j have the same reference numbers. The pixel circuit is fabricated on a substrate 24. The substrate may be the same as described with reference to FIGS. 4a to 4j.

In the first step of the fabrication process (FIG. 7a), a first metal layer 22 is deposited over substrate 24. Lithographic patterning techniques or direct-write printing techniques may be used to structure metal layer 22 and other layers of the pixel structure. In this variation of a top emission structure, the first metal layer 22 forms the drain electrode 52 of a vertical TFT as well as the source electrode 44 and drain electrode 46 of a horizontal transistor, and is patterned accordingly. The first metal layer 22 may be formed from a conducting material such as an inorganic metal, for example, gold, copper or silver, or from a conducting polymer such as PEDOT.

In the second step (FIG. 7b), a first dielectric layer 16 is deposited over the patterned first metal layer 22 and the exposed portions of substrate 24. For manufacturing ease, the dielectric material is deposited over the whole surface of the structure. However, the skilled person would understand that alternative techniques may be employed to deposit the dielectric material in the required areas only, such as by a direct-write printing process, for example, inkjet printing.

In the third step (FIG. 7c), a second metal layer 32 is formed over dielectric layer 16. The second metal layer 32 may be formed from the same conducting metal/polymer as the first metal layer 22 or from a different conductive material. In contrast to the arrangement shown in FIG. 4c, the second metal layer forms only the source electrode 50 of the vertical transistor. The second metal layer may be patterned using similar techniques to those used on the first metal layer.

In the fourth step shown (FIG. 7d) lithographic patterning techniques are first used to pattern dielectric layer 16 into the required form. In contrast to the arrangement of FIGS. 4a to 4j, the dielectric layer 16 above the source and drain electrodes 44, 46 of the horizontal transistor is removed in this step rather than forming a trench. Semiconductor layer 18 is then deposited over the entire surface of the structure.

In the fifth step (FIG. 7e), a second dielectric layer 20 is deposited over the entire surface of the structure. The second dielectric layer 20 may be formed of the same or a different material to that of the first dielectric layer 16. The second dielectric layer 20 may serve as a protection layer for the semiconductor layer below during the subsequent patterning step.

In the sixth step (FIG. 7f), the first and second dielectric layers 16, 20 and semiconductor layer 18 are patterned using RIE. The second dielectric layer 20 and the semiconductor layer 18 are removed between the vertical and horizontal transistors. As explained in relation to the arrangement of FIGS. 4a to 4j, this provides a semiconductor isolation (or shallow trench isolation) which is used to prevent electrical current leakage between the vertical and horizontal transistors, or between the transistors of adjacent pixels in a pixel array.

In the seventh step (FIG. 7g), an extra dielectric layer 21 is deposited. As shown, the deposition of this extra dielectric layer fills in the semiconductor isolation and the gap above the drain electrode which were created in the previous step.

In the next step (FIG. 7h), first and second vias 40a, 40b are formed through the second dielectric layer 20 in order to provide an electrical connections to the drain electrode 46 of the horizontal addressing transistor and the drain electrode 52 of the vertical driving transistor, respectively.

In the next step (FIG. 7i), third metal layer 34 is deposited over the structure and into vias 40a, b to provide the electrical connection. Lithographic patterning may be used to form the metal layer in the desired structure. The third metal layer 34 provides the gate electrode 48 of the horizontal transistor, the row select line to which gate electrode 48 is connected, the gate electrode 54 of the vertical transistor and the pixel electrode 56 of the OLED. The third metal layer 34 may be formed from the same conducting metal/polymer as the first metal layer and/or second metal layer, or from an entirely different conductive material. For an active matrix display, a storage capacitor 36 is formed between the source electrode 50 and the gate electrode 54 of the vertical transistor, where the capacitor enables the pixel state to be actively maintained while other pixels are being addressed. Advantageously, no additional metal layer (i.e. no fourth metal layer) is required to form the storage capacitor in the preferred embodiment of the invention, which reduces manufacturing steps and costs.

In the final step (FIG. 7j), a bank layer 14 is deposited over the structure, where the bank is formed from an insulating material, e.g. a dielectric. As mentioned above, the bank layer 14 partitions each light-emitting element. Lithographic patterning may be used to provide the stepped structure or the walls which define a pixel/OLED area 12.

The OLED area 12 is positioned in the bank layer 14 over the pixel electrode 56, and may extend across the entirety of the pixel electrode 56 or over a smaller area (as illustrated).

Figure 7A:
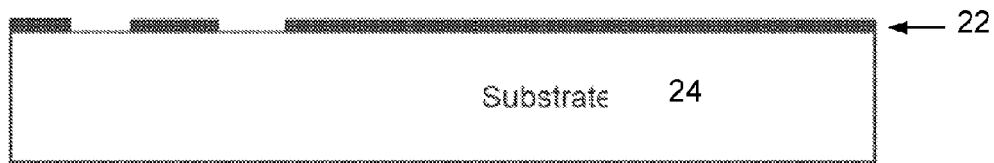
FIGS. 7a to 7j show the step-by-step process of manufacturing an alternative pixel.
Figure 7B:
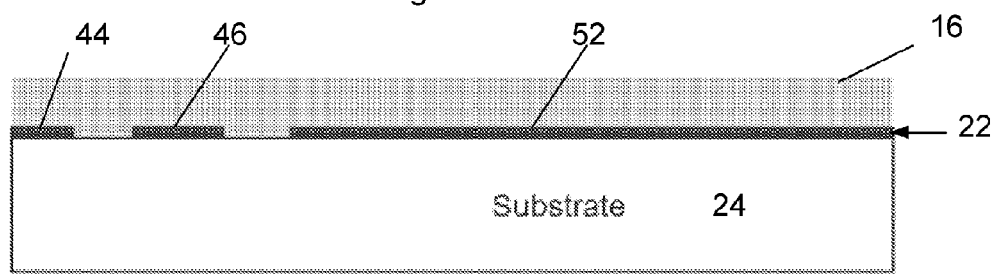
Figure 7C:
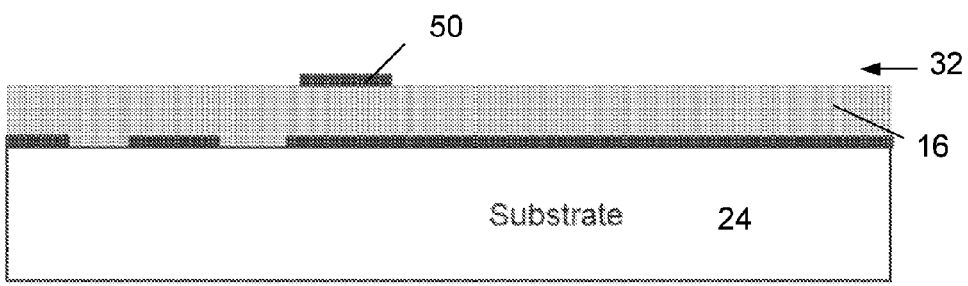
Figure 7D:
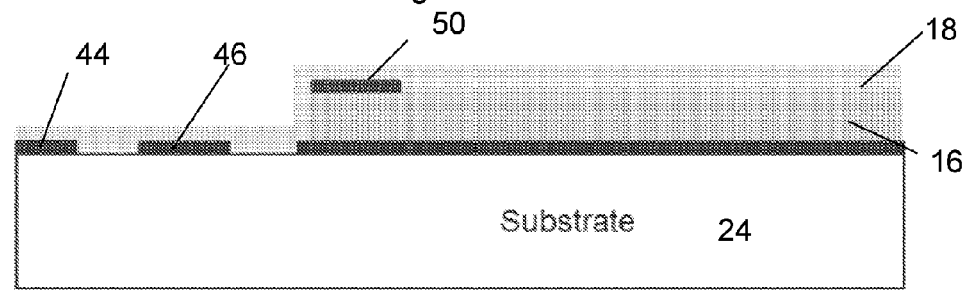
Figure 7E:
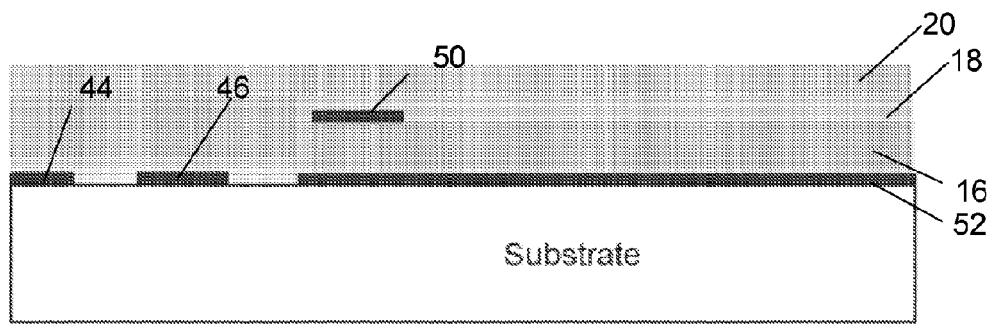
Figure 7F:
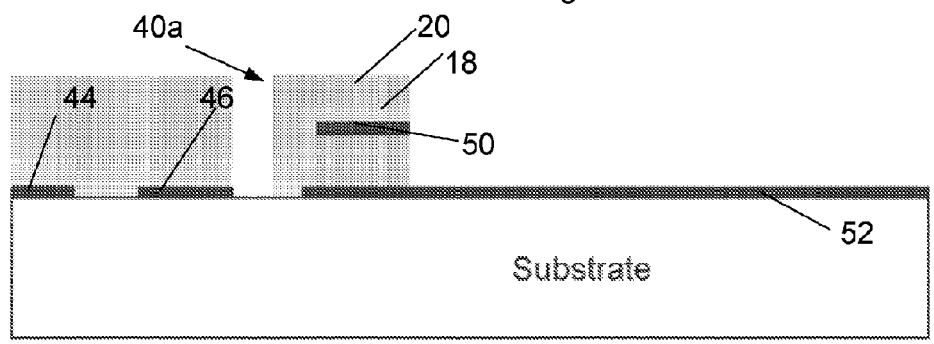
Figure 7G:
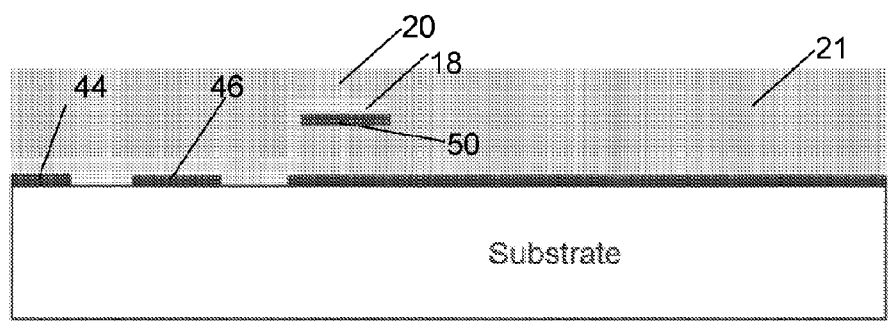
Figure 7H:
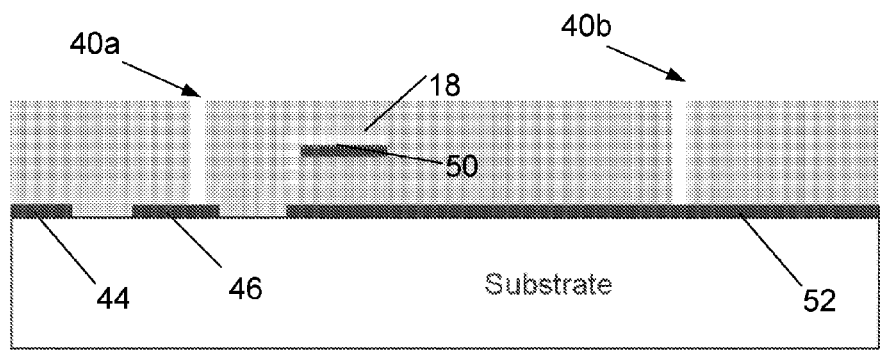
Figure 7I:
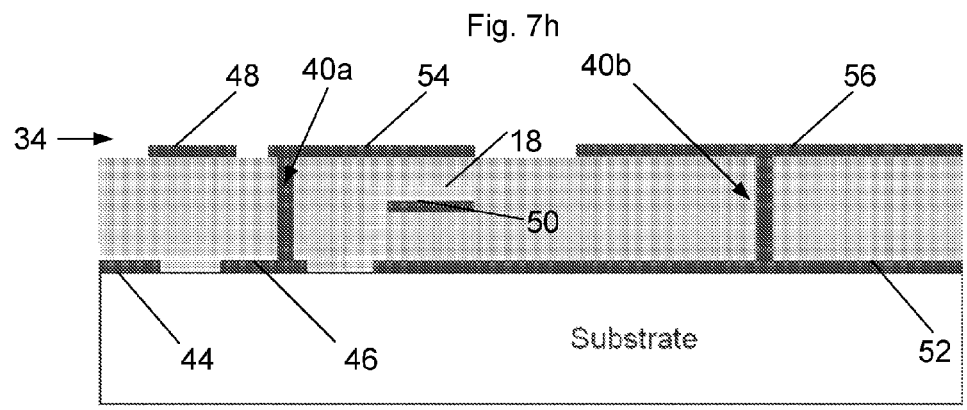
Figure 7J:
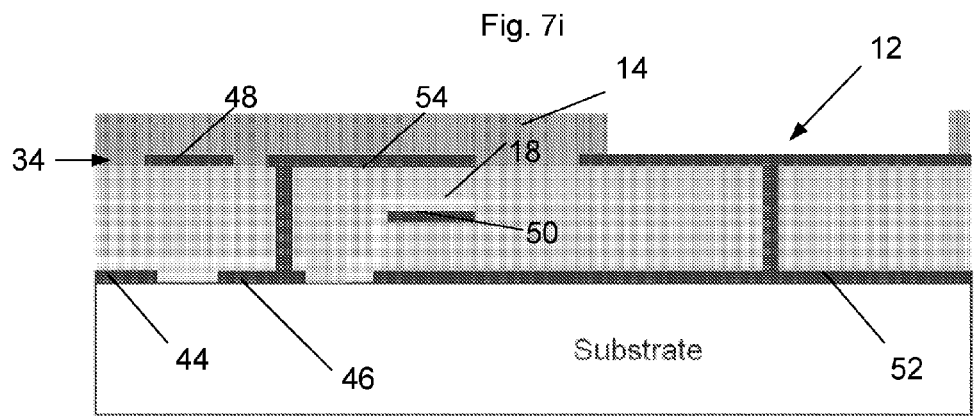
Figure 8:
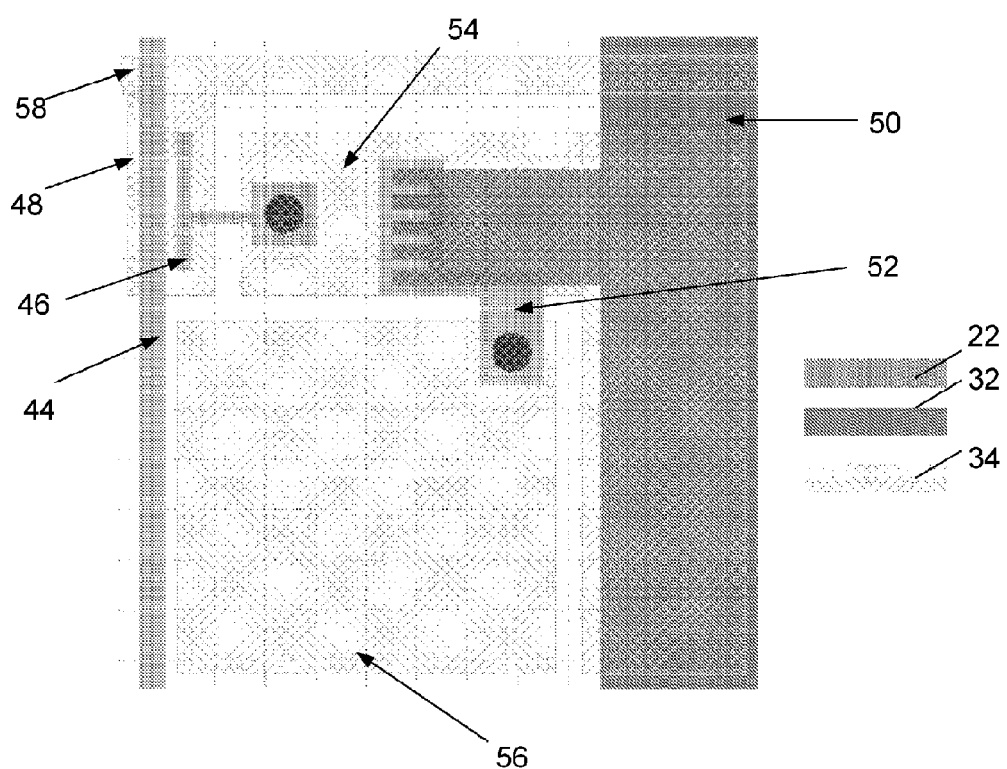
FIG. 8 illustrates a plan view of the pixel made by the process of FIGS. 7a to 7j.

FIG. 8 shows a plan view of the pixel formed using the process of FIGS. 7a to 7j. The first metal layer 22 in the top emission structure of FIG. 8 forms the drain electrode 52 of the vertical transistor and the source and drain electrodes 44, 46 of the horizontal transistor. The second metal layer 32 provides the source electrode 50 of the vertical transistor 26. The third metal layer 34 now forms the gate electrode 48 of the horizontal transistor, the gate electrode 54 of the vertical transistor and the pixel electrode 56. The select line 58 of the pixel structure is also formed in the third metal layer.

Figure 4I:
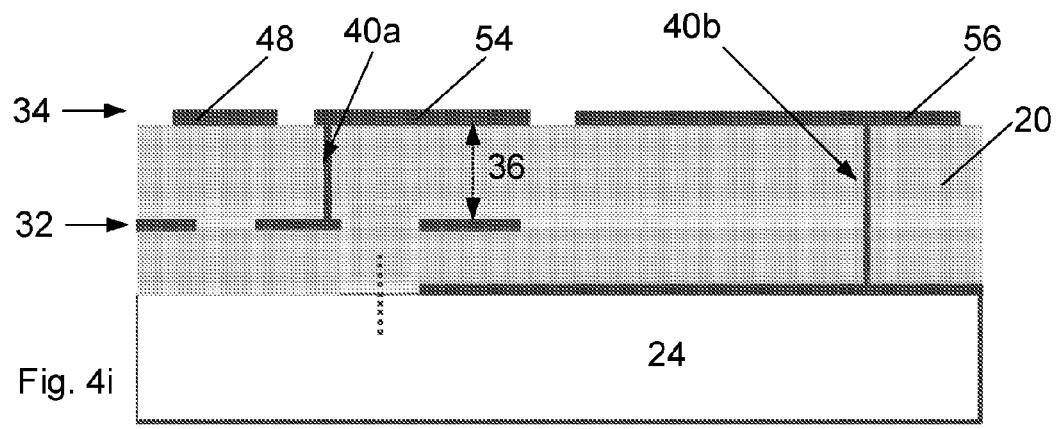
Figure 4J:
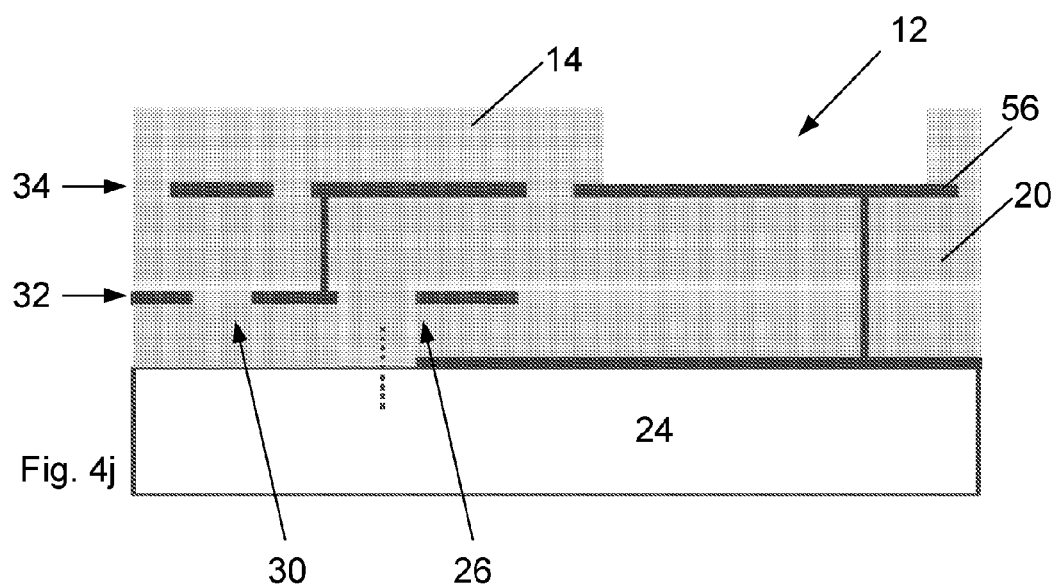
Figure 9:
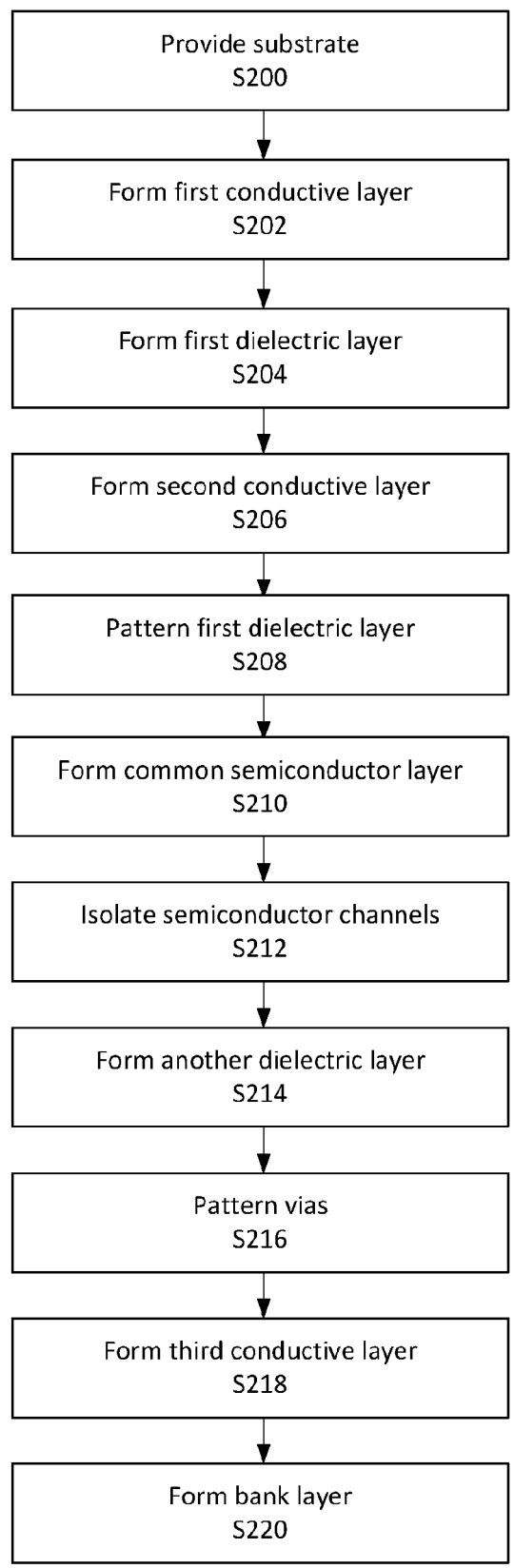
FIG. 9 shows a flow chart summarising the method steps for forming a pixel circuit.

FIG. 9 summarises the method steps used in FIGS. 4a to 4j and FIGS. 7a to 7j. The first step (S200) is to provide a substrate. For a bottom emission structure, the substrate must be transparent but this is not essential for a top emission structure. The first conductive layer is then formed on the substrate (S202). The first conductive layer comprises the drain electrode of the vertical transistor. The first conductive layer may also comprise one or more electrodes from the horizontal transistor. For a top emission structure, the first conductive layer may comprise the source and drain electrodes and for a bottom emission structure the first conductive layer may comprise the gate electrode. Alternatively, there may be no electrodes from the horizontal transistor in the first conductive layer. The conductive layer may comprise metal or a transparent conductive material, particularly for a bottom emission structure Once the conductive layer has been formed to the required pattern, a first dielectric layer is formed over the first conductive layer (S204). A second conductive layer is then formed over the first dielectric layer (S206). This second conductive layer comprises the source electrode of the vertical transistor and may also comprise the source and drain electrodes of the horizontal transistor if these were not formed in the first conductive layer. At least a portion of the source electrode of the vertical transistor is above the drain electrode of the vertical transistor and by forming the layers in this way, the first dielectric layer is sandwiched between the drain and source electrodes of the vertical transistor which enables better control of the channel semiconductor by the gate field. As shown in FIG. 4i and FIG. 7i, the entire semiconductor region of the vertical transistor is included under the gate metal and neither the source nor the drain electrodes are screening the gate field to control the conductance of the channel formed between these two electrodes.

The next step (S208) is then to pattern the first dielectric layer. Where there are electrodes from both transistors in the second conductive layer, patterning the first dielectric layer comprises forming a trench between the two transistors. Where there are no electrodes from the horizontal transistor in the second conductive layer, the patterning comprises removing the dielectric material except that covering the drain electrode of the vertical transistor.

A semiconductor layer is then formed (S210). This semiconductor layer forms the semiconductor channel for both transistors and may thus be described as a common semiconductor layer. However, it is important to isolate the semiconductor channels for both transistors from each other. Accordingly, the next step (S212) is to form this isolation. This may be formed in different ways, for example as shown in more detail in FIGS. 4a to 4j, the semiconductor layer extends into the trench in the first dielectric layer and the isolation channel is formed in the trench. In the example of FIGS. 7a to 7j, an additional dielectric layer is formed as a first step in the isolation process to provide protection for the semiconductor layer. The additional dielectric layer together with the semiconductor layer is then removed from between the two transistors to form the isolation. In both arrangements, semiconductor material is left along the side walls of the drain and source electrodes and the first dielectric layer sandwiched therebetween.

The next step (S214) is to add another dielectric layer which is patterned in the following step (S216) to form vias to connect to the drain electrodes of both the transistors. A third conductive layer (S218) is then formed. The third conductive layer comprises the gate electrode of the vertical transistor. Thus, all three electrodes of the vertical transistor are formed in separate conductive layers which are above one another. Conductive material also fills the vias and a pixel electrode is formed. For a top emission structure, the gate electrode of the horizontal transistor together with the row select lines are formed in the third conductive layer. For a bottom emission structure, these are formed in the first conductive layer. In all arrangements, the three conductive layers are also used to form all the electrodes of the horizontal transistor. Furthermore, the gate electrode of the vertical transistor is formed above the source electrode and a storage capacitor is formed between the source electrode and the gate electrode 54 of the vertical transistor. Thus, an additional metal layer (i.e. no fourth metal layer) for forming the storage capacitor can be avoided. Also, as set out above, the entire semiconductor region of the vertical transistor is included under the gate metal and neither the source nor the drain electrodes are screening the gate field to control the conductance of the channel formed between these two electrodes.

Finally (S220), a bank layer is formed and patterned to receive a light emitting material, e.g. OLED, above the pixel electrode.

When forming the various layers, any known method may be used. For example, a continuous layer may be deposited and patterned required. In particular, photolithography may be used for the patterning. Alternatively, the each layer may be formed by depositing/printing the required pattern. The plurality of conductive layers may be formed from the same or different materials. Similarly, the plurality of dielectric layers may be formed from the same or different materials.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of fabricating a pixel driver circuit using only three conductive layers, the method comprising:
   forming a vertical driver transistor spanning said three conductive layers, wherein a first of said conductive layers on a first side of a middle conductive layer provides a first source-drain connection of said driver transistor, wherein a third of said conductive layers on the opposite side of said middle conductive layer to said first conductive layer provides a gate connection for said vertical driver transistor, and wherein said middle conductive layer provides a second source-drain connection for said vertical driver transistor;
   forming a lateral switching transistor with source-drain connections in one of said three conductive layers;
   wherein a dielectric layer is provided between said first and second conductive layers and between said second and third conductive layers, and wherein semiconductor material is provided spanning said first and second source-drain connections of said vertical driver transistor.

2. A method as claimed in claim 1 further comprising forming a wall extending vertically between said first and second source-drain connections of said vertical driver transistor, wherein said semiconductor material is disposed over said wall to form a vertically-extending channel of said vertical driver transistor.

3. A method as recited in claim 1 further comprising forming a gate-storage capacitor, to store a drive level for said driver transistor, between said middle, second conductive layer and said third conductive layer.

4. A method as claimed in claim 1 further comprising fabricating a dielectric bank over an uppermost of said conductive layers, said bank defining a well for OLED material, wherein a base of said well is formed by said uppermost conductive layer, and wherein said uppermost conductive layer and wherein said uppermost conductive layer is electrically connected to said first source-drain connection of said vertical driver transistor.

5. A method as recited in claim 1 wherein said third conductive layer is an uppermost of said conductive layers, furthest from a substrate of said driver circuit.

6. A method as recited in claim 1, comprising forming the source-drain connections of the lateral switching transistor in the middle conductive layer.

7. A method as claimed in claim 6, further comprising forming a wall extending vertically between said first and second source-drain connections of said vertical driver transistor, wherein said semiconductor material is disposed over said wall to form a vertically-extending channel of said vertical driver transistor and further comprising forming a trench in one of said dielectric layers between the lateral switching transistor and the vertical driver transistor, wherein said wall comprises a sidewall of said trench.

8. A method as recited in claim 6, comprising forming the gate connection of the lateral switching transistor in the first or third conductive layer.

9. A method as recited in claim 1, comprising forming the source-drain connections of the lateral switching transistor in the first conductive layer.

10. A method as claimed in claim 9, further comprising forming a wall extending vertically between said first and second source-drain connections of said vertical driver transistor, wherein said semiconductor material is disposed over said wall to form a vertically-extending channel of said vertical driver transistor and comprising forming the wall by removing the dielectric layer between said first and second conductive layers above the source-drain connections of the lateral switching transistor.

11. A method as recited in claim 9, comprising forming the gate connection of the lateral switching transistor in the third conductive layer.

12. A method as recited in claim 1, comprising providing a common semiconductor for both the lateral switching transistor and the vertical driver transistors.

13. A method as recited in claim 12, comprising isolating the semiconductor material spanning said first and second source-drain connections of said vertical driver transistor from the semiconductor material covering said first and second source-drain connections of said lateral switching transistor.

14. A method as recited in claim 7, comprising isolating the semiconductor material spanning said first and second source-drain connections of said vertical driver transistor from the semiconductor material covering said first and second source-drain connections of said lateral switching transistor and forming a semiconductor isolation in the trench.

15. A method as recited in claim 13, comprising forming a third dielectric layer over the middle conductive layer and removing the third dielectric layer and semiconductor material between the lateral switching transistor and the vertical driver transistors.

16. A pixel driver circuit having only three conductive layers, the pixel driver circuit comprising:
   a vertical driver transistor spanning said three conductive layers, wherein a first of said conductive layers on a first side of a middle conductive layer provides a first source-drain connection of said driver transistor, wherein a third of said conductive layers on the opposite side of said middle conductive layer to said first conductive layer provides a gate connection for said vertical driver transistor, and wherein said middle conductive layer provides a second source-drain connection for said vertical driver transistor;
   a lateral switching transistor with source-drain connections in one of said three conductive layers;
   wherein a dielectric layer is provided between said first and second conductive layers and between said second and third conductive layers, and wherein semiconductor material is provided spanning said first and second source-drain connections of said vertical driver transistor; and
   a pixel display element coupled to said first source-drain connection of said vertical driver transistor.

17. A flexible active matrix backplane comprising a flexible substrate bearing the pixel driver circuit as recited in claim 16.

18. A display comprising the flexible active matrix backplane of claim 17.

19. A method of fabricating a pixel driver circuit using only three conductive layers, the method comprising:
   forming a vertical driver transistor spanning said three conductive layers, wherein a first of said conductive layers on a first side of a middle conductive layer provides a first source-drain connection of said driver transistor, wherein a third of said conductive layers on the opposite side of said middle conductive layer to said first conductive layer provides a gate connection for said vertical driver transistor, and wherein said middle conductive layer provides a second source-drain connection for said vertical driver transistor;
   forming a lateral switching transistor with source-drain connections in one of said three conductive layers; and
   further comprising forming a wall extending vertically between said first and second source-drain connections of said vertical driver transistor, wherein said semiconductor material is disposed over said wall to form a vertically-extending channel of said vertical driver transistor;
   wherein a dielectric layer is provided between said first and second conductive layers and between said second and third conductive layers, and
   wherein semiconductor material is provided spanning said first and second source-drain connections of said vertical driver transistor.

20. A method as claimed in claim 19, further comprising forming a trench in one of said dielectric layers between the lateral switching transistor and the vertical driver transistor, wherein said wall comprises a sidewall of said trench and said semiconductor material is formed in the trench.

* * * * *